US007654308B2

(12) United States Patent
Hofmann

(10) Patent No.: US 7,654,308 B2
(45) Date of Patent: *Feb. 2, 2010

(54) HEAT EXCHANGER

(75) Inventor: Wilfried Hofmann, Munich (DE)

(73) Assignee: NFT Nanofiltertechnik GmbH, Bad Homburg V.D.H. (DE)

( * ) Notice: Subject to any disclaimer, the term of this patent is extended or adjusted under 35 U.S.C. 154(b) by 453 days.

This patent is subject to a terminal disclaimer.

(21) Appl. No.: 10/970,209

(22) Filed: Oct. 21, 2004

(65) Prior Publication Data

US 2005/0126754 A1   Jun. 16, 2005

(30) Foreign Application Priority Data

Oct. 22, 2003   (DE)   ................. 203 16 334

(51) Int. Cl.
*H05K 7/20*   (2006.01)
(52) U.S. Cl. ................... 165/80.3; 165/121; 165/109.1; 165/903; 165/908; 361/695; 361/697
(58) Field of Classification Search ............... 165/80.3, 165/109.1, 903, 908, 121; 361/695, 697
See application file for complete search history.

(56) References Cited

U.S. PATENT DOCUMENTS

| 4,859,805 | A | | 8/1989 | Kawakami et al. | |
|---|---|---|---|---|---|
| 5,077,601 | A | * | 12/1991 | Hatada et al. | 257/722 |
| 5,787,975 | A | | 8/1998 | Grenier et al. | |
| 6,067,227 | A | | 5/2000 | Katsui et al. | |
| 7,458,416 | B2 | * | 12/2008 | Hofmann | 165/121 |
| 2005/0252644 | A1 | * | 11/2005 | Hofmann | 165/109.1 |

FOREIGN PATENT DOCUMENTS

| DE | 38 22 890 A1 | 9/1989 |
|---|---|---|
| DE | 39 29 004 A1 | 3/1991 |
| DE | 92 14 061 U1 | 10/1992 |
| DE | 196 19 060 A1 | 11/1997 |
| DE | 198 13 119 A1 | 10/1999 |
| DE | 100 41 829 A1 | 3/2002 |
| DE | 102 33 736 B3 | 4/2004 |
| EP | 0 308 576 A2 | 3/1989 |
| GB | 2407435 A * | 4/2005 |
| JP | 11-186762 A | 7/1999 |
| JP | 2003338694 A * | 11/2003 |

* cited by examiner

*Primary Examiner*—John K Ford
(74) *Attorney, Agent, or Firm*—Senniger Powers LLP

(57) ABSTRACT

A heat exchanger which has a base plate and several carrier plates projecting from the base plate. At least one cooling element is located on each carrier plate. The cooling elements have a substrate with an underside and an upper side. Webs project from the upper side of the substrate and lie one behind the other, the height of which is less than the distance between adjacent webs. The substrate has a plurality of regularly arranged channels that extend through the substrate.

25 Claims, 4 Drawing Sheets

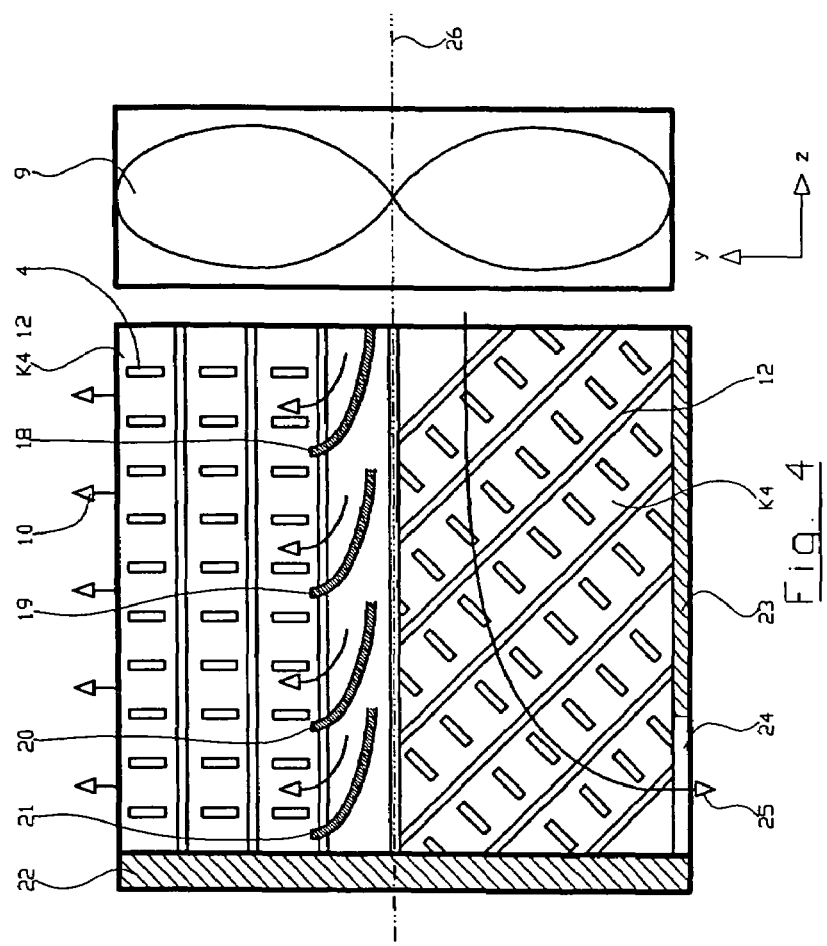
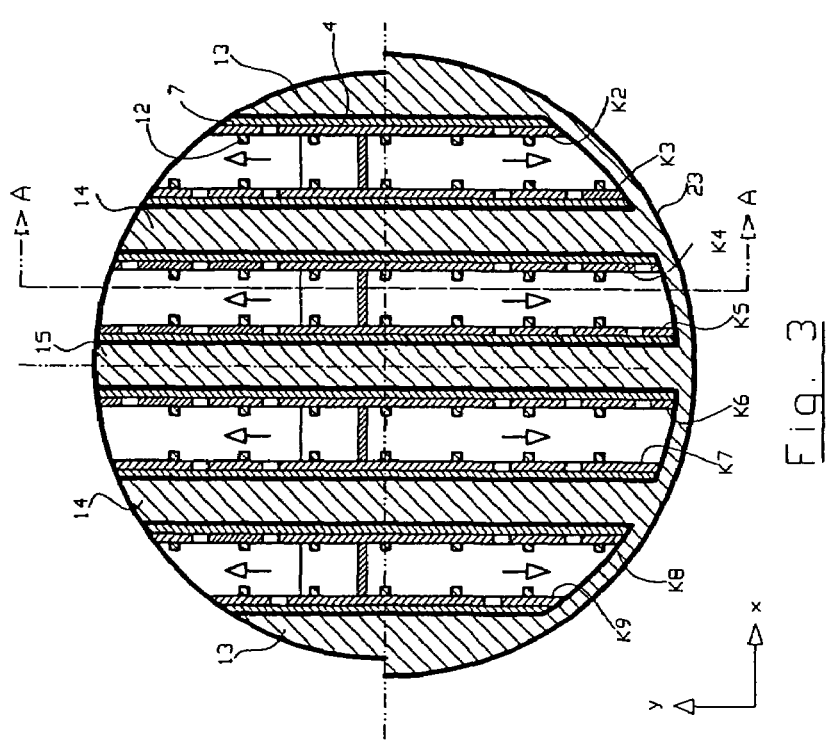
Fig. 3
Fig. 4

HEAT EXCHANGER

FIELD OF THE INVENTION

The invention relates to a heat exchanger.

BACKGROUND OF THE INVENTION

German Patent Application DE 102 33 736.5, which was not previously published, discloses a heat-exchanging device which has a substrate formed as a thin plate with an underside and an upper side and a device to produce an oriented fluid flow, where the underside and the upper side of the substrate are tangentially crossed by the flow. Webs lying one behind the other in the flow direction project from the upper side of the substrate, where the height of said webs is less than the distance between adjacent webs in the flow direction. The webs are arranged transverse to the flow direction. The substrate also has a plurality of channels which are regularly arranged between the webs and which extend through the substrate.

DE 39 29 004 A1 discloses a heat-exchanging device with double plates, which have partitions on their inside and/or outside surfaces, which are shaped as beads or webs, lying transverse to the flow direction. These webs lie one behind the other in the flow direction, where the height of said webs is less than the distance between adjacent webs. The webs create turbulence in the flowing medium and thus effect an improved heat transfer.

DE 38 22 890 A1 shows a cooling arrangement with a blower and a plurality of cooling elements arranged parallel to one another, which are formed from elongated cooling webs and intervening gap openings, where the cooling webs of two adjacent cooling elements are staggered so that, in the flow direction, the cooling webs of one cooling element cover the gap opening of the adjacent cooling element.

DE 198 13 119 A1 shows a turbulence heat recovery device with profile plates, whose profiles in the plate plane are placed alternatingly opposed at the same angle, inclined with respect to the longitudinal extension of the pressure gradient. This is intended to create a turbulent flow, which improves the heat exchange performance.

Cooling devices with a substrate through which channels extend are also known from DE 196 19 060 A1 and EP 0 308 576 A2. The channels can be rectangular or circular.

DE 92 14 061 U1 describes a cooling body, whose heat introduction surface has ribs and furrows to increase the surface.

Heat-exchanging devices of the type described above are used, for example, to cool electronic components, such as microprocessors or chips. Generally, one distinguishes between active and passive cooling devices. With active cooling devices, units such as blowers or ventilators are used either to support or effect heat transport with the aid of a fluid flow. The fluid flow created flows over a cooling body, which is coupled to a heat source and absorbs waste heat from it. Known cooling bodies have a ribbed or columnar structure, e.g., with partially roughened surfaces. The fluid flowing through or around the cooling body thereby absorbs the heat. Air is generally used as the fluid during the cooling of processors. Since air is a poor heat conductor, the cooling bodies must be designed to be relatively large, so as to have heat-liberating surfaces which are large in proportion to the heat introduction surface. For this purpose, the proposal is made in DE 100 41 829 A1 that the heat-liberating surface be substantially larger than the heat introduction surface, which is realized by a prespecified structuring in the form of channels and in the form of furrows, which have a flow connection with the channels.

In addition to the large dimensions, a problem with active heat-exchanging devices is the energy required to create the fluid flow. An effective heat transfer is associated with a relatively high power consumption and spatial requirements for the corresponding device, such as a blower. Also, a good heat transfer takes place from the heat-liberating surface to the fluid, if the heat-liberating surface has a relatively high flow resistance toward the fluid flow, which, however, requires a stronger blower and thus a higher power consumption.

The initially mentioned heat-exchanging device in accordance with DE 102 33 736, which was not previously published, solves the problem of a high heat exchanger performance with low flow resistance and small spatial requirements and also makes possible a good heat transfer using air as a fluid.

In many application purposes, however, the heat source—that is, for example, an electronic component, such as a microchip—is substantially smaller with respect to its heat-liberating surface than an initially described cooling element, so that the cooling element cannot be directly coupled to the heat-liberating surface of the object to be cooled. Thus, the problem arises of transporting the heat energy as rapidly and completely as possible to the cooling elements from where it can then be removed to the surroundings by the fluid.

SUMMARY OF THE INVENTION

The problem described above is solved by the features indicated in Claim 1. Advantageous developments and refinements of the invention can be drawn from the subordinate claims.

The basic principle of the invention consists in providing a heat introduction body with a basic plate and several carrier plates projecting therefrom, wherein at least one cooling element is placed on each carrier plate.

Preferably, the carrier plates are parallel to one another and perpendicular to the base plate. The cooling elements are placed on the sides of the carrier plates, which are facing an adjacent carrier plate. In other words, a cooling element need not be provided on the outside carrier plates. The webs of the cooling plates are preferably perpendicular on the base plate. In order to save weight, the base plate and/or the carrier plates are made of aluminum. For better heat conduction, a copper layer is then present between the base plate and the carrier plates. A copper layer can also be provided on the underside of the base plate facing the cooling object; the layer is in direct contact with the heat-liberating surface of the object to be cooled, and preferably has only one surface corresponding to the heat-liberating surface of the object.

Preferably, the device for the creation of an oriented fluid flow, in particular, a ventilator, is arranged above the carrier plates, so that its flow initially is aimed essentially perpendicular with respect to the base plate. Additional baffle plates, which are preferably located between the carrier plates, deflect the fluid flow so that it is then directed essentially parallel to the base plate and to the carrier plates.

BRIEF DESCRIPTION OF THE FIGURES

FIG. 3, a cross section (sectional top view) of a heat-exchanging device according to a second embodiment example of the invention;

FIG. 4, a section along line A-A of FIG. 3; and

DETAILED DESCRIPTION OF PREFERRED EMBODIMENTS

This application claims priority from German application 203 16 334.6, filed Oct. 22, 2003, the entire disclosure of which is expressly incorporated herein by reference.

Figure 1:
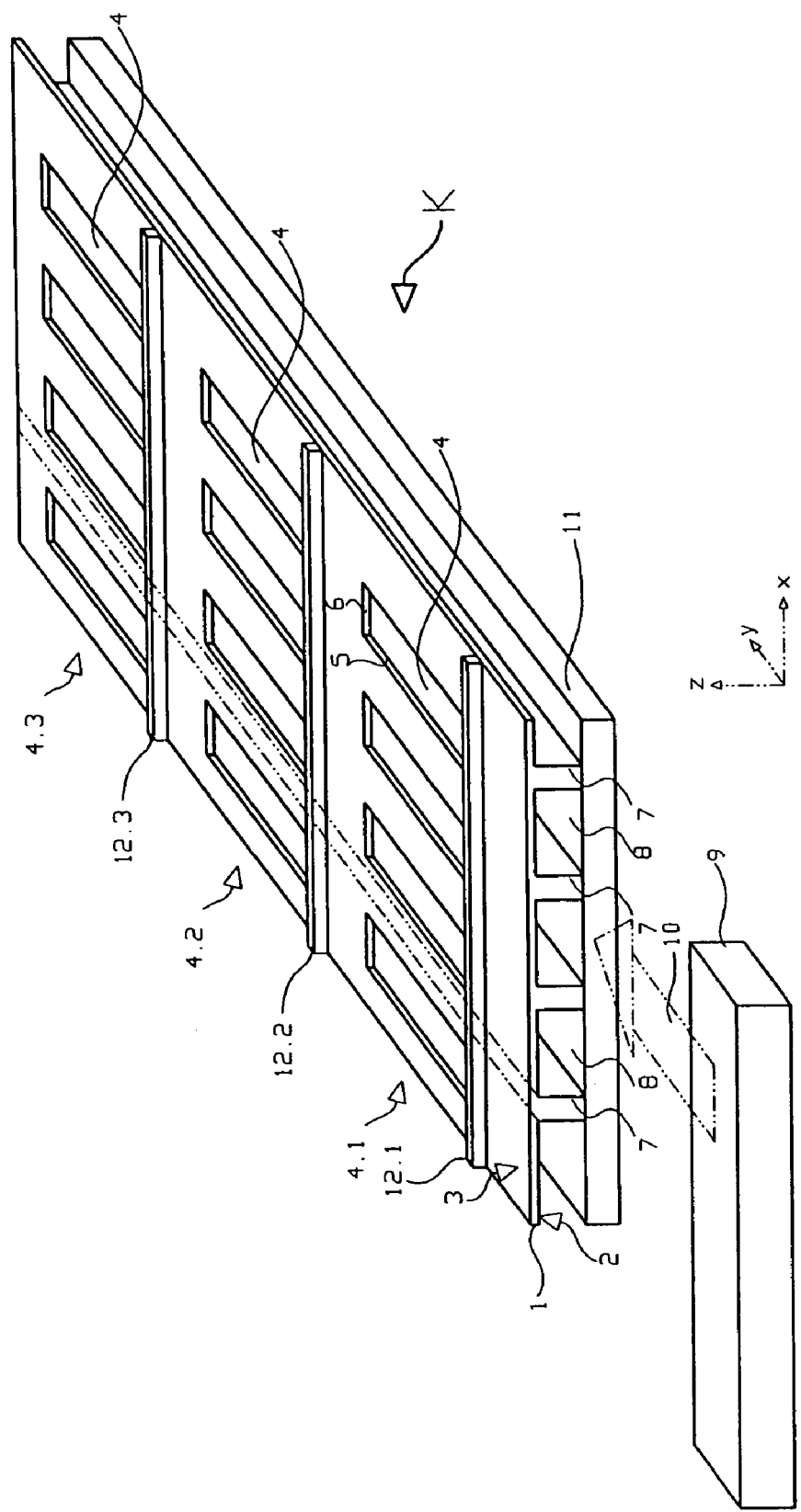
FIG. 1, a perspective partial view of a cooling element used in the invention.

First, reference is made to FIG. 1. A cooling element K has a substrate 1 with an underside 2 and an upper side 3, where the substrate has a plurality of regularly arranged channels 4 that extend through substrate 1 that, in this case, are rectangular. The channels have a longitudinal edge 5 and a transverse edge 6. The substrate 1 is held opposite the surface of an object 11 by spacers 7, where the spacers 7 extend over the entire length of the substrate 1. Several parallel spacers 7 are provided, which are positioned to lie between the channels 4. In this way, other channels 8 are formed between the substrate 1, the object 11, and the spacers 7, which run along the substrate 1. A device 9, a blower, for example, produces an oriented fluid flow that moves in the direction of the arrow 10 (referred to below as the flow direction 10), both through the channels 8 and thus along the underside 2 as well as along the surface 3 of the substrate 1 and partially also through the channels 4—and partially in both directions—that is, from the top down and elsewhere from the bottom up. The spacers 7 can be designed in one piece with the substrate 1. However, they can also project from the surface of an object 11 to be cooled and thus be constructed on its surface.

Webs 12.1, 12.2, 12.3 that extend transverse to the flow direction 10, are provided upstream in the flow direction 10 to create turbulences which effect an improved heat transfer. On the other hand, the webs 12.1, 12.2 are so low that they increase the flow resistance only slightly and therefore are also designated microhindrances.

Experiments have shown that three rows 4.1, 4.2, and 4.3 of channels lying one behind the other in the flow direction 10 and three webs 12.1, 12.2, and 12.3 lying one behind the other in the flow direction, which lie upstream of the rows of channels in the flow direction 10, are completely sufficient for a good heat transport, since most of the heat has already been removed after the third row of channels. Of course, more or fewer than three rows of channels and webs are also possible.

Figure 2:
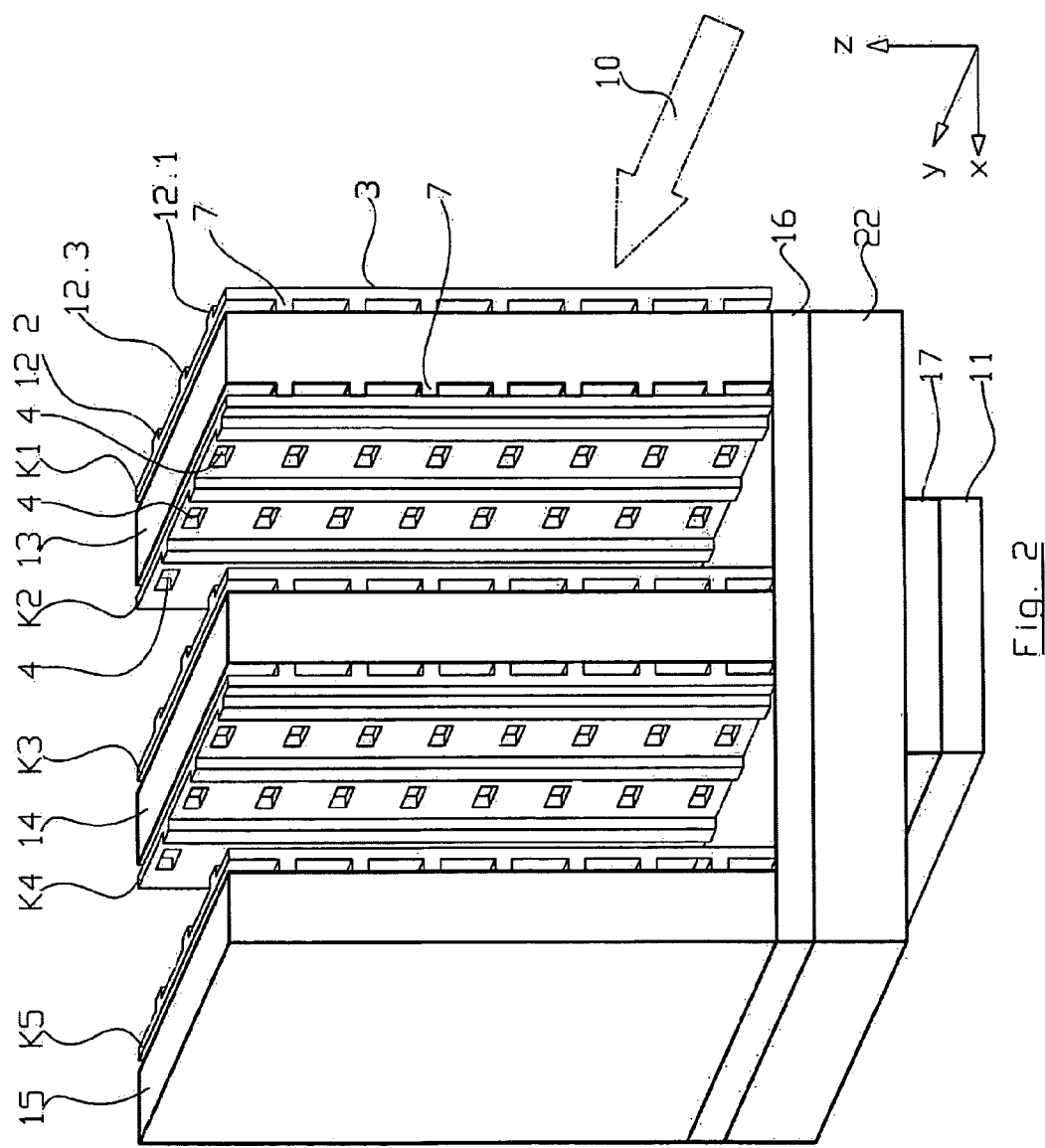
FIG. 2, a perspective view of a heat-exchanging device according to a first embodiment example of the invention.

FIG. 2 shows a first embodiment example of the invention, in which several cooling elements are used in accordance with FIG. 1.

The device has a flat base plane 22, from which several carrier plates 13, 14, 15 project perpendicularly. Here, the carrier plates 13-15 are designed to be rectangular parallelopipedal and are parallel to one another, where a gap is present between adjacent carrier plates, such as 13 and 14 or 14 and 15.

The carrier plates 13-15 can be placed directly on the base plate 22. Also, an intervening plate 16 can be placed between the base plate 22 and the carrier plates 13-15, which is then made of another material. The preferred material for the base plate 22 and the carrier plates 13-15 is aluminum, where, if the intervening plate 16 is omitted, the base plate 22 and the carrier plates 15 are then one piece. Aluminum is preferred in order to save weight even if a certain disadvantage of only mediocre heat conductivity must be accepted. Alternatively, the intervening plate 16 is preferably made of copper, which is heavier than aluminum but is a better heat conductor. Cooling elements K1 to K5, in accordance with the cooling element K of FIG. 1, are placed on the side surface of the carrier plates 13-15, where the spacers 7 are in heat-conductive contact with the surface of the carrier plates 13-15. The webs 12 of the cooling elements K1 to K5 are placed perpendicular to the base plate 22 and run parallel to the side surfaces of the carrier plates. The main flow direction is also designated here by the arrow 10.

The cooling elements K2-K5 are placed on those surfaces of the carrier plates which point to an adjacent carrier plate. These are, for example, the cooling elements K2, K3, K4, and K5. Cooling elements can also be placed on the outsides of carrier plates 13 and 15 such that they do not point to an adjacent carrier plate, like cooling element K1 on carrier plate 13. As shown in the example of carrier plate 15, the outside there is not provided with a cooling element. One can also see on the inside of the carrier plate 13, which points to the cooling element K2, that the spacers 7 can be designed integrally with the carrier plate 13, whereas with the cooling elements K1, K3, K4, and K5, they are a constituent part of the cooling element. The first of the aforementioned cases has the advantage that the cooling elements without spacers have a flat underside, which provides, above all, certain technical advantages during fabrication and facilitates assembly.

The number of the carrier plates is arbitrary and depends on the thermal output to be removed.

Normally, the heat-liberating surface of the object to be cooled 11 is smaller than the basic surface area of the base plate 22. In order to obtain a good and rapid heat removal from the object 11, another intervening plate 17 is provided between the underside of the base plate 22 and the heat-liberating surface of the object 11; this intervening plate is also preferably made of copper and thus provides a fast, good heat removal. In the case where the base plate 22 itself is made of copper, the intervening plate 17 can, of course, be omitted.

It is apparent from FIG. 2 that the main flow direction 10 is tangential to the heat-liberating surface of the object 11 to be cooled. During the cooling of microprocessors or other electronic components, it is often common for structural purposes to place the device to create an oriented fluid flow (for example, in the case of a ventilator) above the object and the cooling body, where the flow then is initially vertical, from the top down (the negative z direction). In order then to bring the flow in the desired direction 10 (that is, in the y direction), baffle plates (not shown) are provided which deflect the flow.

FIG. 3 shows a corresponding embodiment example in a cross section and FIG. 4, in a section along line A-A of FIG. 3.

It can be seen from the sectional top view of FIG. 3 that the base plate 22 here has the form of a circular disk, on which a total of five carrier plates 13, 14, 15, 14', and 13' are arranged, on the outside surfaces of which cooling elements K2 to K9 are placed so that they point to the adjacent carrier plate. A ventilator 9 is placed above the front sides of the carrier plates and generates an air flow that first moves in the negative z direction. In the gaps between adjacent carrier plates, at least one pair of any two of deflection plates 18, 19, 20, and 21 are arranged, which deflects the flow in the y direction or opposite to the y direction, and thus again assumes the main flow direction 10. In the lower part of FIGS. 3 and 4, another variant is shown, in which the gaps between the opposite carrier plates are partially closed by a wall 23, where this wall has an opening 24 close only to the base plate 22, through which air can flow out. In this way, a flow deflection takes place forcibly, which is designated by the arrow 25. So that the flow direction runs essentially orthogonal to the webs 12, the cooling elements, as, for example, here the cooling element K4, are inclined with respect to the main axis 26 of the heat-exchanging device, wherein then the baffle plates of the upper part of FIGS. 3 and 4 can be omitted.

Figure 5:
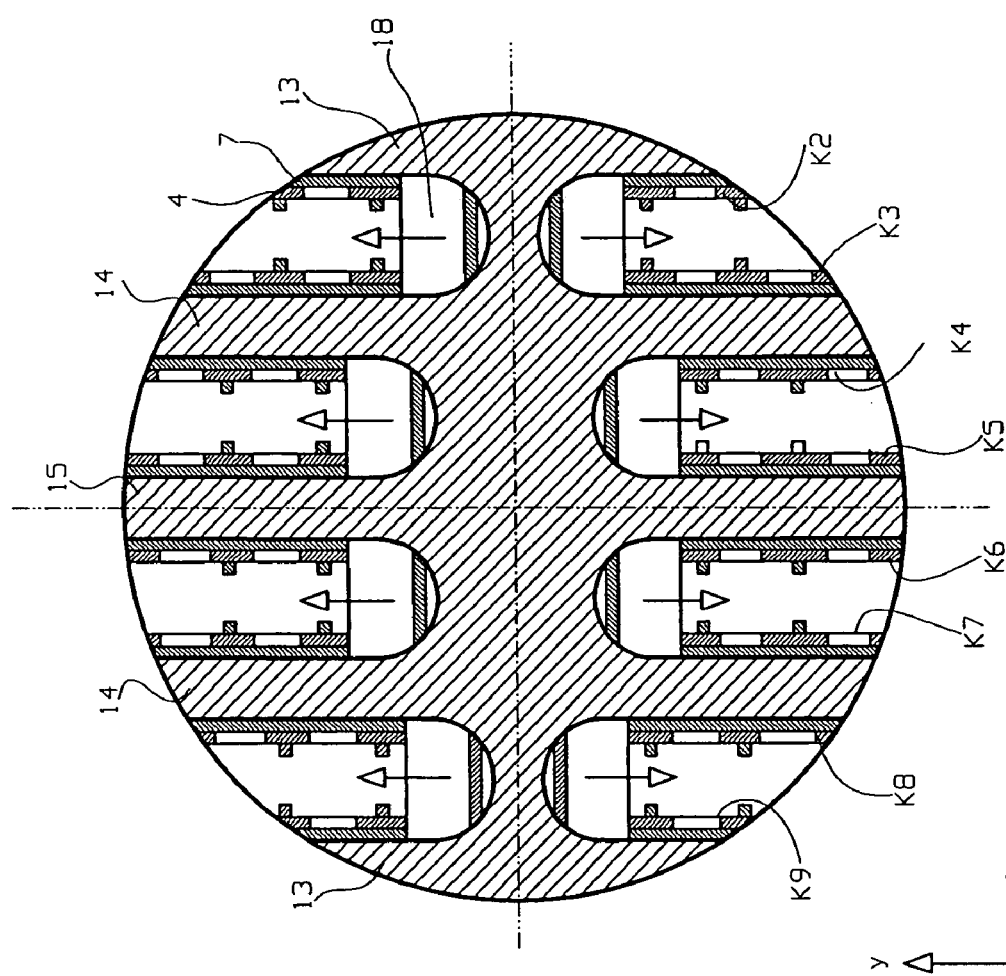
FIG. 5, a section similar to FIG. 3 according to a third embodiment example of the invention.

In the embodiment example of FIG. 5, the carrier plates 13, 14, 15, 14', and 13' are connected to one another as a single piece, wherein then the cooling elements are inserted into the gaps and also deflection plates 18, where only one deflection plate is needed per gap. Since one part of the flow produced by the ventilator (not shown), which is located above the plane of the drawing of FIG. 5, strikes the front surface of the carrier plates and a deflection already takes place into the xy plane, the deflection plates can also be omitted. It is also possible to place the cooling elements at an inclination to the base plate 22 so that the webs 12 are transverse to the main flow direction being established.

In view of the above, it will be seen that the several objects of the invention are achieved and other advantageous results attained.

As various changes could be made in the above methods and products without departing from the scope of the invention, it is intended that all matter contained in the above description and shown in the accompanying drawings shall be interpreted as illustrative and not in a limiting sense.

What is claimed is:

1. A heat exchanger comprising:
   a heat conducting element which has a base plate, a plurality of carrier plates projecting from the base plate, and a plurality of cooling elements wherein at least one of the cooling elements is located on each carrier plate;
   said plurality of cooling elements each comprising a substrate having an underside facing the carrier plate the cooling element is on, an upper side facing away from the carrier plate the cooling element is on, and webs projecting from the side facing away from the carrier plate the cooling element is on and lying one behind the other and having a height which is less than a distance between adjacent webs, wherein the substrate has a plurality of regularly arranged channels extending through the substrate, and wherein the webs are oriented for placement transverse to a fluid flow with a flow direction that is tangential to the underside and to the upper side of the substrate.

2. The heat exchanger of claim 1 wherein the carrier plates are parallel to one another and perpendicular to the base plate.

3. The heat exchanger of claim 1 wherein the cooling elements are placed on sides of the carrier plates which face an adjacent carrier plate.

4. The heat exchanger of claim 2 wherein the cooling elements are placed on sides of the carrier plates which face an adjacent carrier plate.

5. The heat exchanger of claim 1 wherein the webs of the cooling elements extend perpendicular to the base plate.

6. The heat exchanger of claim 2 wherein the webs of the cooling elements extend perpendicular to the base plate.

7. The heat exchanger of claim 3 wherein the webs of the cooling elements extend perpendicular to the base plate.

8. The heat exchanger of claim 4 wherein the webs of the cooling elements extend perpendicular to the base plate.

9. The heat exchanger of claim 1 wherein the base plate is made of aluminum.

10. The heat exchanger of claim 1 wherein the carrier plates are made of aluminum.

11. The heat exchanger of claim 9 wherein an intervening plate made of copper is placed between the base plate and the carrier plates.

12. The heat exchanger of claim 10 wherein an intervening plate made of copper is placed between the base plate and the carrier plates.

13. The heat exchanger of claim 12 wherein another intervening plate made of copper is placed on the underside of the base plate facing away from the carrier plates.

14. The heat exchanger of claim 1 further comprising baffle plates which deflect a fluid flow, incoming perpendicular to the base plate, in a direction tangential to the base plate, which are arranged between adjacent carrier plates.

15. The heat exchanger of claim 2 further comprising baffle plates which deflect a fluid flow, incoming perpendicular to the base plate, in a direction tangential to the base plate, which are arranged between adjacent carrier plates.

16. The heat exchanger of claim 3 further comprising baffle plates which deflect a fluid flow, incoming perpendicular to the base plate, in a direction tangential to the base plate, which are arranged between adjacent carrier plates.

17. The heat exchanger of claim 5 further comprising baffle plates which deflect a fluid flow, incoming perpendicular to the base plate, in a direction tangential to the base plate, which are arranged between adjacent carrier plates.

18. The heat exchanger of claim 14 further comprising a ventilator placed above free ends of the carrier plates, which creates a fluid flow that runs perpendicular to the surface of the base plate.

19. The heat exchanger of claim 1 wherein the substrate of the cooling elements is held at a distance to the carrier plates by spacers.

20. The heat exchanger of claim 2 wherein the substrate of the cooling elements is held at a distance to the carrier plates by spacers.

21. The heat exchanger of claim 3 wherein the substrate of the cooling elements is held at a distance to the carrier plates by spacers.

22. The heat exchanger of claim 5 wherein the substrate of the cooling elements is held at a distance to the carrier plates by spacers.

23. The heat exchanger of claim 19 wherein the spacers are integrally connected to the substrate.

24. The heat exchanger of claim 19 wherein the spacers are integrally connected to the associated carrier plate.

25. A heat exchanger comprising:
   a heat conducting element which has a base plate, a plurality of carrier plates projecting from the base plate and a plurality of cooling elements, wherein at least one of the cooling elements is located on each carrier plate;
   the plurality of cooling elements each comprising a substrate having an underside facing the carrier plate the cooling element is on, an upper side facing away from the carrier plate the cooling element is on, and webs projecting from the side facing away from the carrier plate the cooling element is on and lying one behind the other and having a height which is less than a distance between adjacent webs, wherein the substrate has a plurality of regularly arranged channels extending through the substrate, and a device for the creation of an oriented fluid flow with a flow direction that is tangential to the substrate underside facing the carrier plate the cooling element is on and to the substrate upper side facing away from the carrier plate the cooling element is on and runs transverse to the webs.

* * * * *